United States Patent
Luo et al.

(10) Patent No.: US 10,115,453 B2
(45) Date of Patent: Oct. 30, 2018

(54) INTEGRATED CIRCUITS WITH SRAM DEVICES HAVING READ ASSIST CIRCUITS AND METHODS FOR OPERATING SUCH CIRCUITS

(71) Applicant: Globalfoundries Singapore Pte. Ltd., Singapore (SG)

(72) Inventors: Zhihong Luo, Singapore (SG); Qi Chen, Singapore (SG); Joanne Jinling Wang, Singapore (SG); Yi Liang, Singapore (SG); Fei Xu, Singapore (SG); Benjamin Shui Chor Lau, Singapore (SG); Bai Yen Nguyen, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 37 days.

(21) Appl. No.: 15/383,083

(22) Filed: Dec. 19, 2016

(65) Prior Publication Data

US 2018/0174646 A1 Jun. 21, 2018

(51) Int. Cl.
*G11C 7/00* (2006.01)
*G11C 16/04* (2006.01)
*G11C 11/419* (2006.01)

(52) U.S. Cl.
CPC .................. *G11C 11/419* (2013.01)

(58) Field of Classification Search
CPC ....... G11C 11/419; G11C 11/413; G11C 7/12; G11C 5/14; G11C 7/22; G11C 8/08
See application file for complete search history.

(56) References Cited

U.S. PATENT DOCUMENTS

| 6,198,685 | B1* | 3/2001 | Sudo | G11C 8/08 365/230.06 |
|---|---|---|---|---|
| 7,672,182 | B2 | 3/2010 | Park et al. | |
| 7,952,955 | B2* | 5/2011 | Kodama | G11C 8/08 365/189.11 |
| 2011/0141825 | A1* | 6/2011 | Hatanaka | G11C 11/417 365/189.07 |
| 2012/0014172 | A1* | 1/2012 | Jung | G11C 11/413 365/154 |
| 2015/0365075 | A1* | 12/2015 | Kawa | H03K 19/00384 327/210 |
| 2015/0371686 | A1 | 12/2015 | Van Winkelhoff et al. | |
| 2016/0049191 | A1* | 2/2016 | Siddiqui | G11C 11/419 365/154 |
| 2017/0301396 | A1* | 10/2017 | Dhori | G11C 11/419 |
| 2017/0372774 | A1* | 12/2017 | Walker | G11C 11/419 |

* cited by examiner

*Primary Examiner* — Hien Nguyen
(74) *Attorney, Agent, or Firm* — Lorenz & Kopf, LLP

(57) ABSTRACT

Integrated circuits including semiconductor memory devices, read assist circuits for semiconductor memory devices, and methods for operating such circuits are provided. In an embodiment, a read assist circuit for use in a semiconductor memory device is provided. The read assist circuit includes a first drive device for driving a wordline of the semiconductor memory device to a wordline driving voltage. The first drive device operates at a first current. The read assist circuit also includes a second drive device for maintaining the wordline of the semiconductor memory device at the wordline driving voltage. The second drive device operates at a second current lower than the first current.

20 Claims, 5 Drawing Sheets

INTEGRATED CIRCUITS WITH SRAM DEVICES HAVING READ ASSIST CIRCUITS AND METHODS FOR OPERATING SUCH CIRCUITS

TECHNICAL FIELD

The technical field generally relates to static random access memory (SRAM), and more particularly relates to read assist techniques when operating SRAM devices.

BACKGROUND

SRAM is a commonly used volatile memory device. Therefore, when the power source supplied to SRAM is shut down, the data stored in SRAM disappear. The memory cells in SRAM are used for storing data by changing the conduction state of the internal transistors in a memory cell. This is quite different from dynamic RAM (DRAM) which stores data by charging and discharging capacitors. The access speed of SRAM is very fast so it is widely applied to computer systems as cache memory.

As contemporary memories have progressed towards ever smaller process scales and lower operating voltages, it is known that it may be necessary to take steps to ensure that read stability is maintained. Read stability relates to the ability of a memory to maintain the value of a data bit held by a bit cell of the memory without change when the data bit is read. Contemporary memory may be at a level where access disturbance margin (ADM) or static noise margin (SNM) impacts read stability. Impacted read stability can, for example, result from process variation or non-optimal operating voltages.

One known technique for addressing read instability is to lower the voltage applied to the relevant wordline for at least part of the read process. By applying a lower voltage to the bit cell access gates, in particular during the early portion of the read process, the internal nodes are less disturbed and the bit cell is more stable. Various techniques are known for achieving this lowered voltage on the wordline, such as charge injection/extraction solutions, which seek to vary the wordline voltage by selectively connecting a capacitive element to the wordline, yet these known techniques are susceptible to process and temperature variation. Frequently, a transistor is connected to the wordline to pull down the wordline high logic value ("1") voltage. To keep the wordline driving speed sufficiently high, the transistor is large and consumes a large amount of DC current.

Accordingly, it is desirable to provide an improved SRAM memory with read assist. Further, it is desirable to provide a technique that enables application of a read assist wordline voltage while utilizing a reduce current as compared to conventional techniques. Furthermore, other desirable features and characteristics will become apparent from the subsequent detailed description and the appended claims, taken in conjunction with the accompanying drawings and this background.

BRIEF SUMMARY

Integrated circuits including semiconductor memory devices, read assist circuits for semiconductor memory devices, and methods for operating such circuits are provided. In an embodiment, a read assist circuit for use in a semiconductor memory device is provided. The read assist circuit includes a first drive device for driving a wordline of the semiconductor memory device to a wordline driving voltage. The first drive device operates at a first current. The read assist circuit also includes a second drive device for maintaining the wordline of the semiconductor memory device at the wordline driving voltage. The second drive device operates at a second current lower than the first current.

In another exemplary embodiment, an integrated circuit including a semiconductor memory device is provided. The semiconductor memory device includes an array of bit cells and a plurality of wordlines. Each bit cell of the array of bit cells is selectively coupled to a wordline of the plurality of wordlines. Access to a selected bit cell of the array of bit cells requires an asserted voltage on a selected wordline with which the selected bit cell is associated. The semiconductor memory device includes read assist circuitry configured, when read access to the selected bit cell is carried out, to implement a reduction in the asserted voltage on the selected wordline. The read assist circuitry is configured to drive the selected wordline to the asserted voltage using a first current and to maintain the selected wordline at the asserted voltage using a second current lower than the first current.

In yet another exemplary embodiment, a method for operating a read assist circuit includes activating a read assist signal and activating a first current to drive a selected wordline to an asserted voltage. Further, the method for operating a read assist circuit includes deactivating the first current and maintaining the selected wordline at the asserted voltage with a second current. The second current is lower than the first current.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits including semiconductor memory devices, read assist circuits for semiconductor memory devices, and methods for operating such circuits. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. Further, it is noted that semiconductor devices include a varying number of components and that single components shown in the illustrations may be representative of multiple components.

Figure 1:
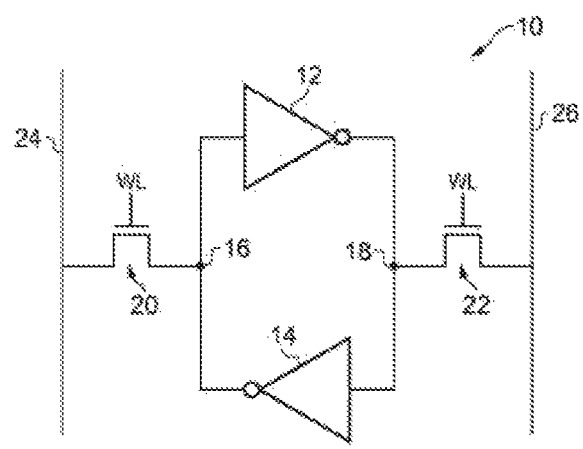
FIG. 1 schematically illustrates a known memory bit cell.

FIG. 1 schematically illustrates a known SRAM cell or bit cell 10 which essentially includes a pair of cross-coupled inverters 12 and 14. The configuration of these inverters 12 and 14 is such that the cell 10 can stably hold a pair of complementary values at the nodes 16 and 18. A pair of access transistors 20, 22 couples the nodes 16, 18 to bit lines 24, 26 to enable the pair of values held at the nodes 16, 18 to be written and read out. A wordline signal (WL) is applied to the gates of the access transistors 20, 22 to address and control the on/off states of the access transistors 20, 22. The data are written in or read from the nodes 16, 18 through the bit lines 24, 26.

Figure 2:
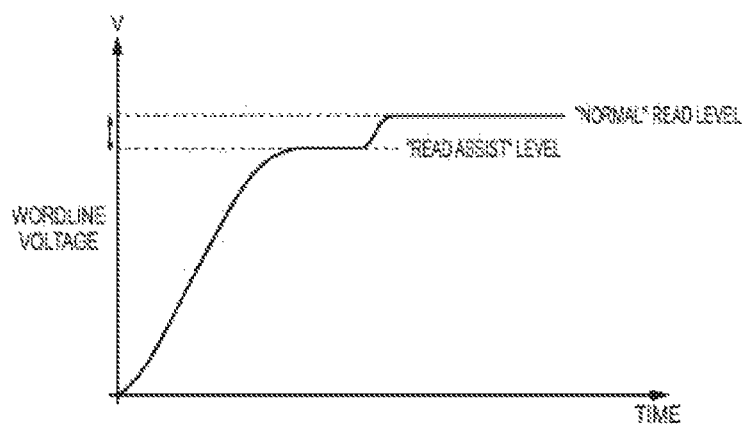
FIG. 2 shows a known example of the reduction in the wordline voltage to a "read assist" level.

In order to improve the read stability of the cell 10, when a read operation is carried out the wordline signal voltage is asserted as is shown in FIG. 2. As shown, the wordline voltage is temporarily held back from reaching the "normal" read level at a "read assist" level, which in an exemplary embodiment, is approximately 50 mV below the "normal" read level. One of ordinary skill in the art will be familiar with the manner in which this reduction in the wordline read voltage helps to prevent the content of the cell 10 from being disturbed by the read process and further description thereof is dispensed with here for brevity.

Figure 3:
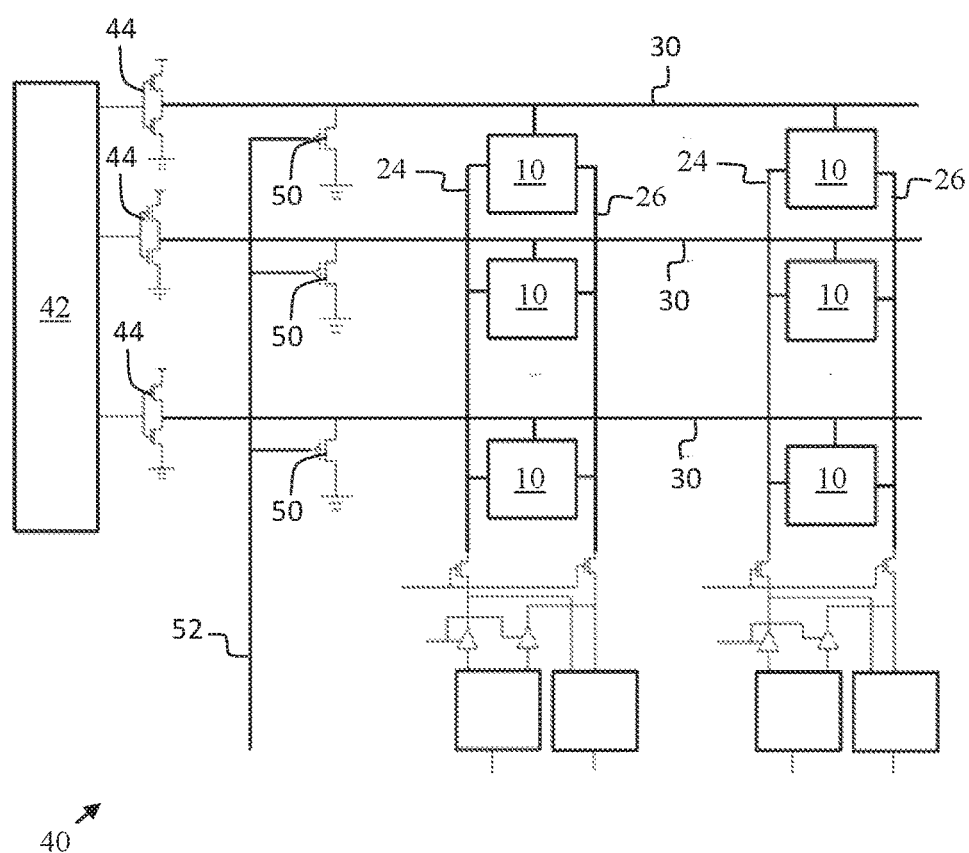
FIG. 3 is a schematic view of a memory cell array utilizing a known read assist technique.

FIG. 3 is a block diagram showing circuit connections of a typical SRAM with read assist capability. In FIG. 3, the cells 10 of FIG. 1 are arranged in an SRAM cell array 40, as is typical of prior art integrated circuit memory designs. The SRAM cell array 40 includes a plurality of bit lines 24, 26 extending in parallel in a first direction. Each of the cells 10 of SRAM cell array 40 includes inverters 12, 14 and access transistors 20, 22 as shown in FIG. 1, arranged in electrical series between bit lines 24, 26. The SRAM cell array 40 includes a plurality of wordlines 30. Each wordline 30 in the plurality of wordlines extends in parallel in a second direction and is in electrical communication with wordline decoder/driver 42.

Reading or writing to a cell 10 of SRAM cell array 40 can be achieved by applying an appropriate voltage to the corresponding wordline 30 and an appropriate voltage or current to the corresponding bit line 24, 26 to induce a current through the cell 10. The level and duration of the voltages/currents applied is dependent upon the operation performed, e.g. a reading operation or a writing operation, as is well known.

As shown, the prior art SRAM cell array 40 provides for read assist capability through use of a last stage buffer 44 and PMOS transistor 50. As shown, a buffer 44 is coupled to each wordline 30. Further, a PMOS transistor 50 is coupled to each wordline 30. The source of each transistor 50 is coupled to a wordline 30 and the drain of each transistor is coupled to ground voltage. As shown, the gate of each transistor 50 is coupled to a Read Assist select line 52. Each transistor 50 may be selectively activated by a Read Assist signal on select line 52. When activated, a transistor 50 may pull down the wordline high logic value ("1") voltage. To keep the wordline driving speed sufficiently high, the size of the buffer 44 and the transistor 50 need to be large. As a result, a large DC current is consumed by the buffer 44 and transistor 50.

Figure 4:
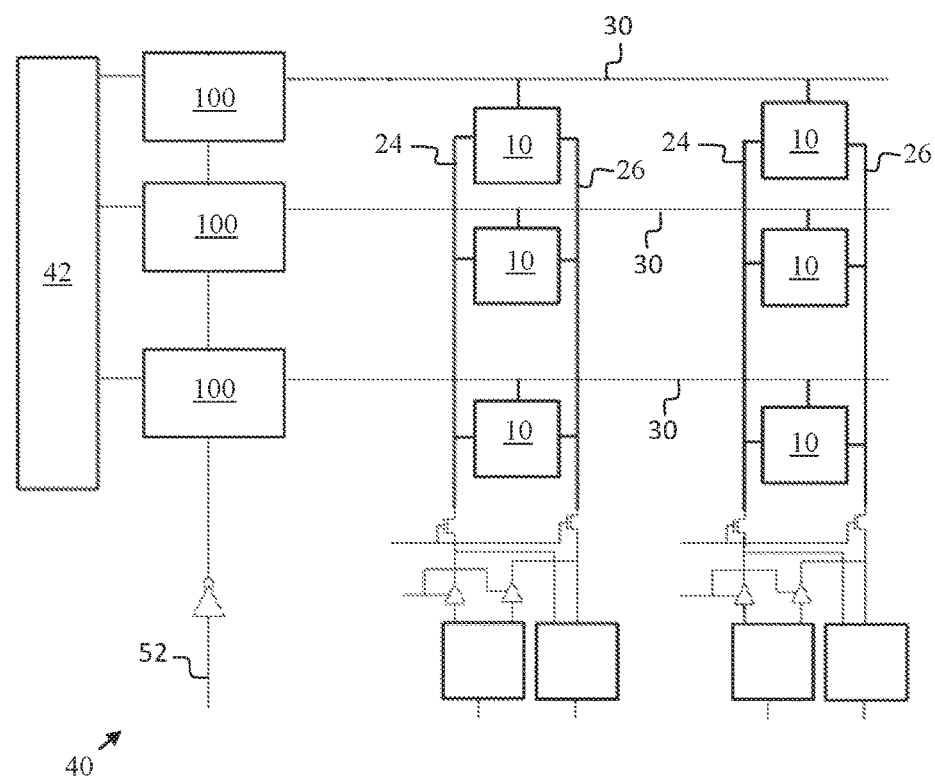
FIG. 4 is a schematic view of an exemplary memory cell array with a read assist circuit coupled to each wordline in accordance with an embodiment herein.

FIG. 4 illustrates an exemplary embodiment in which a read assist circuit 100 is coupled to each wordline 30 to pull down the wordline high logic value ("1") voltage while reducing the amount of current consumed during operation. As shown, a read assist circuit 100 is coupled to each wordline 30 between the wordline decoder/driver 42 and the cells 10.

Figure 5:
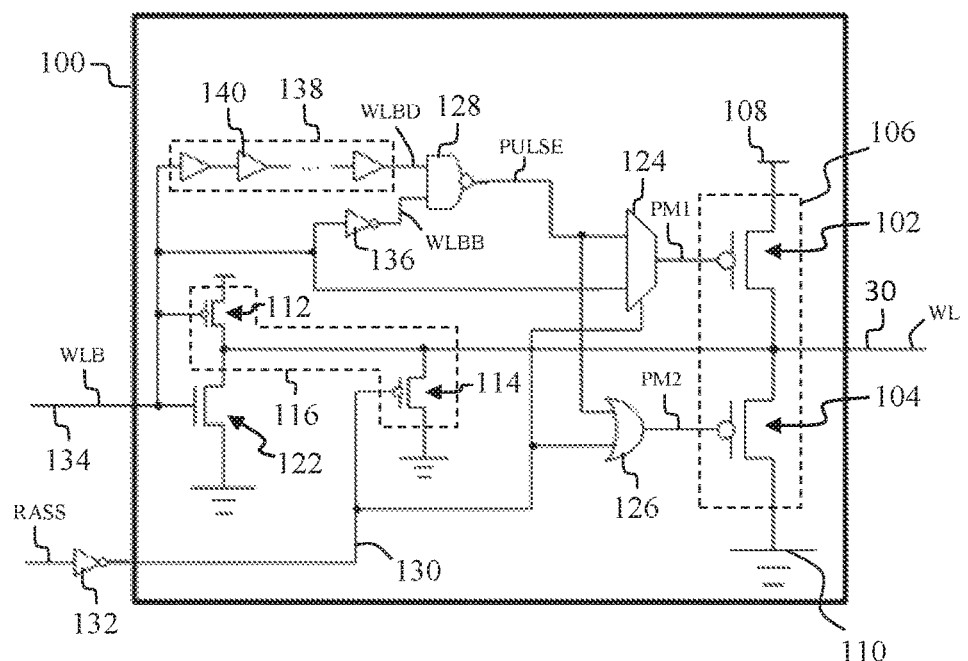
FIG. 5 is a schematic view of a read assist circuit from FIG. 4 in accordance with an embodiment herein.

FIG. 5 illustrates an exemplary embodiment of a read assist circuit 100. As shown, the read assist circuit 100 includes a transistor 102 and a transistor 104 connected in series. In an exemplary embodiment, transistor 102 and transistor 104 are PMOS transistors, i.e., PFETs. Together, transistor 102 and transistor 104 form a drive device or voltage divider 106. The wordline 30 is coupled to the voltage divider 106 intermediate of transistor 102 and transistor 104. In the exemplary embodiment, the source of transistor 102 is coupled to a first reference voltage, such as a supply voltage (Vdd), 108 and the drain of transistor 102 is coupled to the source of transistor 104. Further, the drain of transistor 104 is coupled to a second reference voltage, such as a ground voltage (Vss) 110. In the illustrated embodiment, therefore, the wordline 30 is coupled to the drain of the transistor 102 and to the source of the transistor 104.

In an exemplary embodiment, transistor 102 may be considered to be a wordline main pull up transistor and transistor 104 may be considered to be a wordline main pull down transistor. In an exemplary embodiment, transistors 102 and 104 are sized to have a cell size ratio that provides the reduced voltage on the wordline at the expected value. For example, transistor 102 may have a cell size that is from about 3 times to about 8 times larger than the cell size of transistor 104. An exemplary transistor 102 has a cell size that is about 5.33 times the cell size of transistor 104. In an exemplary embodiment, transistor 102 has a cell size of about 16 micrometers (μm) and transistor 104 has a cell size of 3 μm.

The read assist circuit 100 further includes a transistor 112 and a transistor 114 connected in series. In an exemplary embodiment, transistor 112 and transistor 114 are PMOS transistors, i.e., PFETs. Together, transistor 112 and transistor 114 form a drive device or voltage divider 116. The wordline 30 is coupled to the voltage divider 116 intermediate of transistor 112 and transistor 114. In the exemplary embodiment, the source of transistor 112 is coupled to the supply voltage (Vdd) 108 and the drain of transistor 112 is coupled to the source of the transistor 114. Further, the drain of transistor 114 is coupled to ground voltage (Vss) 110. In the illustrated embodiment, therefore, the wordline 30 is coupled to the drain of the transistor 112 and to the source of the transistor 114.

In an exemplary embodiment, transistors 112 and 114 are sized to have a cell size ratio that provides the reduced voltage on the wordline at the same or about the same expected value as transistors 102 and 104. In other words, transistors 112 and 114 have a cell size ratio substantially equal to the cell size ratio of transistors 102 and 104. For example, transistor 112 may have a cell size that is from about 3 times to about 8 times larger than the cell size of transistor 114. An exemplary transistor 112 has a cell size that is about 5.33 times the cell size of transistor 114.

In an exemplary embodiment, each transistor 112 and 114 has a cell size that is much smaller than the cell size of transistor 102 or 104. For example, each transistor 112 and 114 may have a cell size that is less than one quarter, such as less than 20%, of the cell size of transistor 102 or 104. In an exemplary embodiment, each transistor 112 and 114 may have a cell size that is from about 5% to about 20%, for example about 10%, of the cell size of transistor 102 or 104. In an exemplary embodiment, transistor 112 has a cell size of about 1.6 μm and transistor 114 has a cell size of 0.3 μm.

Each voltage divider 106, 116 is configured to generate at a midpoint of the voltage divider 106, 116 a mid-voltage between the supply voltage 108 and the ground voltage 110. As shown, the midpoint of each voltage divider 106, 116 is connected to the wordline 30. Using a voltage divider supports a relatively simple configuration for enabling read assist and moreover, the fact that such a voltage resistor divider can be composed of the same transistor components as the bit cells of the memory device means that the performance of the voltage divider can be particularly stable. It should be understood that here the use of the terms "mid-voltage" and "midpoint" does not necessarily imply any equal division of the voltage range spanned between the first reference voltage and the second reference voltage, but rather any voltage that lies within that range—in dependence on the particular configuration of the voltage divider.

The read assist circuit 100 further includes a transistor 122. In an exemplary embodiment, transistor 122 is an NMOS transistor, i.e., an NFET. As shown, the source of transistor 122 is coupled to the wordline 30 and the drain of transistor 122 is coupled to ground voltage (Vss) 110.

As shown, the read assist circuit 100 further includes a logic gate 124 with an output coupled to the gate of transistor 102. An exemplary logic gate 124 is a multiplexer or MUX gate. Further, the read assist circuit 100 includes a logic gate 126 with an output coupled to the gate of transistor 104. An exemplary logic gate 126 is an OR gate. Also, the read assist circuit 100 includes a logic gate 128. Logic gate 128 includes an output coupled as an input to logic gate 124 and as an input to logic gate 126. An exemplary logic gate 128 is a NAND gate.

The read assist circuit 100 includes a select line 130. An exemplary select line 130 passes through an inverter 132. As shown, select line 130 is coupled to the gate of transistor 114. Further, select line 130 is coupled as a selection bit input to logic gate 124. Also, select line 130 is coupled as an input to logic gate 126.

The read assist circuit 100 also includes a signal line 134. Signal line 134 is coupled to the gate of transistor 122. Signal line 134 is also coupled to the gate of transistor 112. Further, signal line 134 is coupled as a data bit input to logic gate 124. Also, signal line 134 is coupled as an input to an inverter 136. Output of the inverter 136 is coupled as an input to logic gate 128. Signal line 134 is further coupled as an input to a delay device 138. In an exemplary embodiment, the delay device 138 is formed by a plurality of inverters or buffers 140. An exemplary delay device 138 includes an even number of inverters or buffers 140. As shown, output of delay device 138 is coupled as an input to logic gate 128.

In an exemplary embodiment, when activated during a read assist operation, transistor 102 and transistor 104 conduct a drive signal with a first current and apply a first voltage to wordline 30. Further, when activated during a read assist operation, transistor 112 and transistor 114 conduct a drive signal with a second current and an apply the first voltage to wordline 30. In an exemplary embodiment, the second current is lower than the first current, such as less than 50%, less than 25%, or less than 10% of the first current.

Operation of the read assist circuit 100 is performed under two states: when read assist is enabled and when read assist is disabled. Read assist is enabled when a select signal (RASS) received by inverter 132 has a high logic value, i.e., equals logic "1". Read assist is disabled when select signal (RASS) received by inverter 132 has a low logic value, i.e., equals logic "0".

During operation when read assist is disabled, select signal (RASS) has a low logic value. Inverter 132 on select line 130 inverts the select signal (RASS) to form a high logic value signal. The high logic value inverted signal applied to the gate of PMOS transistor 114 along select line 130 causes the PMOS transistor 114 to be turned OFF. Further, the high logic value inverted signal is inputted to the OR gate 126. As a result, OR gate 126 necessarily outputs a high logic value as an output (PM2) to the gate of PMOS transistor 104 and causes the PMOS transistor 104 to be turned OFF. Also, the high logic value inverted signal is inputted to the MUX gate 124 as a selection bit input. As a result, the MUX gate 124 selects an input from signal line 134 as the data bit input.

As further shown, a signal (WLB) is received by the read assist circuit on signal line 134. Signal (WLB) has a low or high logic value, such as "0" or "1". When signal (WLB) has a low logic value, the low logic value signal (WLB) is applied along signal line 134 to the gate of NMOS transistor 122 and NMOS transistor 122 is turned OFF. Further, the low logic value signal (WLB) is applied along signal line 134 to the gate of PMOS transistor 112 and PMOS transistor 112 is turned ON. Also, the low logic value signal (WLB) is inputted to the MUX gate 124 from signal line 134. As a result, MUX gate 124 provides a low logic value output (PM1) to the gate of PMOS transistor 102. Therefore, PMOS transistor 102 is turned ON.

As shown, the low logic value signal (WLB) is received and inverted by inverter 136 to form a high logic value inverted signal (WLBB). The high logic value inverted signal (WLBB) outputted by inverter 136 is received as an input by NAND gate 128. Further, the low logic value signal (WLB) is received and delayed by delay device 138 to form a low logic value delayed signal (WLBD). The low logic value delayed signal (WLBD) outputted by delay device 138 is received as an input by NAND gate 128. As a result, the NAND gate 128 outputs a high logic value output signal (PULSE). The high logic value output signal (PULSE) is inputted to the MUX gate 124, though when read assist is disabled, the MUX gate selects the input from signal (WLB) and the logic value of the output signal (PULSE) is immaterial. The high logic value output signal (PULSE) is also inputted to the OR gate 126, though when read assist is disabled, the OR gate 126 receives a high logic value inverted signal on select line 130, and the logic value of the output signal (PULSE) is immaterial.

As a result, when read assist is disabled and signal (WLB) has a low logic value, the supply voltage is applied to the wordline (WL) both through PMOS transistor 102 and through PMOS transistor 112.

TABLE 1

Read Assist Disabled

| | | |
|---|---|---|
| WLB = 0 | PFET 112 ON | NFET 122 OFF |
| RASS = 0 | PFET 114 OFF | MUX selects WLB |
| | PFET 102 ON | PFET 104 OFF |
| | | WL = 1 |

When signal (WLB) has a high logic value, the high logic value signal (WLB) is applied along signal line 134 to the gate of NMOS transistor 122 and NMOS transistor 122 is turned ON. Further, the high logic value signal (WLB) is applied along signal line 134 to the gate of PMOS transistor 112 and PMOS transistor 112 is turned OFF. Also, the high logic value signal (WLB) is inputted to the MUX gate 124 from signal line 134. As a result, MUX gate 124 provides a high logic value output (PM1) to the gate of PMOS transistor 102. Therefore, PMOS transistor 102 is turned OFF.

As shown, the high logic value signal (WLB) is received and inverted by inverter 136 to form a low logic value inverted signal (WLBB). The low logic value inverted signal (WLBB) outputted by inverter 136 is received as an input by NAND gate 128. Further, the high logic value signal (WLB) is received and delayed by delay device 138 to form a high logic value delayed signal (WLBD). The high logic value delayed signal (WLBD) outputted by delay device 138 is received as an input by NAND gate 128. As a result, the NAND gate 128 outputs a low logic value output signal (PULSE). The low logic value output signal (PULSE) is inputted to the MUX gate 124, though when read assist is disabled, the MUX gate selects the input from signal (WLB) and the logic value of the output signal (PULSE) is immaterial.

The low logic value output signal (PULSE) is also inputted to the OR gate 126, though when read assist is disabled, the OR gate 126 receives a low logic value inverted signal on select line 130, and the logic value of the output signal (PULSE) is immaterial. The OR gate 126 outputs a high logic value as an output (PM2) to the gate of PMOS transistor 104 and causes the PMOS transistor 104 to be turned OFF.

As a result, when read assist is disabled and signal (WLB) has a high logic value, each PMOS transistor 102, 104, 112 and 114 is turned OFF. Therefore, no voltage is applied to the wordline (WL) by the read assist circuit 100. Further, NMOS transistor 122 is turned ON and fully discharges the wordline (WL) to Vss (0 volts).

TABLE 2

| Read Assist Disabled | | |
|---|---|---|
| WLB = 1 | PFET 112 OFF | NFET 122 ON |
| RASS = 0 | PFET 114 OFF | MUX selects WLB |
| | PFET 102 OFF | PFET 104 OFF |
| | | WL = 0 |

During operation when read assist is enabled, select signal (RASS) has a high logic value. Inverter 132 on select line 130 inverts the select signal (RASS) to form a low logic value inverted signal. The low logic value inverted signal applied to the gate of PMOS transistor 114 along select line 130 causes the PMOS transistor 114 to be turned ON. Further, the low logic value inverted signal is inputted to the OR gate 126. Also, the low logic value inverted signal is inputted to the MUX gate 124 as a selection bit input. As a result, the MUX gate 124 selects an input from NAND gate output (PULSE) as the data bit input.

When signal (WLB) has a low logic value, the low logic value signal (WLB) is applied along signal line 134 to the gate of NMOS transistor 122 and NMOS transistor 122 is turned OFF. Further, the low logic value signal (WLB) is applied along signal line 134 to the gate of PMOS transistor 112 and PMOS transistor 112 is turned ON. Also, the low logic value signal (WLB) is inputted to the MUX gate 124 from signal line 134. As noted above, when read assist is enabled, the MUX gate 124 selects the NAND output (PULSE) rather than the signal (WLB).

As shown, the high logic value signal (WLB) is further received and inverted by inverter 136 to form a low logic value inverted signal (WLBB). The low logic value inverted signal (WLBB) outputted by inverter 136 is received as an input by NAND gate 128. Further, the high logic value signal (WLB) is received and delayed by delay device 138 to form a high logic value delayed signal (WLBD). The high logic value delayed signal (WLBD) outputted by delay device 138 is received as an input by NAND gate 128. As a result, the NAND gate 128 outputs a high logic value output signal (PULSE). The high logic value output signal (PULSE) is inputted to the MUX gate 124. Because read assist is enabled, the MUX gate selects the high logic value output signal (PULSE). As a result, MUX gate 124 provides a high logic value output (PM1) to the gate of PMOS transistor 102. Therefore, PMOS transistor 102 is turned OFF.

The high logic value output signal (PULSE) is also inputted to the OR gate 126. Thus, OR gate 126 necessarily outputs a high logic value as an output (PM2) to the gate of PMOS transistor 104 and causes the PMOS transistor 104 to be turned OFF.

As a result, when read assist is enabled and signal (WLB) has a low logic value, both PMOS transistor 112 and PMOS transistor 114 are ON and a reduced voltage is applied to the wordline (WL) through the voltage divider 116 formed by PMOS transistor 112 and PMOS transistor 114. The reduced voltage is applied while a lower current is conducted by PMOS transistors 112 and 114.

Table 3 describes the status of transistors and operation described above.

TABLE 3

| Read Assist Enabled | | |
|---|---|---|
| WLB = 0 | PFET 112 ON | NFET 122 OFF |
| RASS = 1 | PFET 114 ON | MUX selects PULSE |
| NAND/PULSE = 1 | PFET 102 OFF | PFET 104 OFF |
| | | WL = 1 |

When read assist is enabled and signal (WLB) has a high logic value, the high logic value signal (WLB) is applied along signal line 134 to the gate of NMOS transistor 122 and NMOS transistor 122 is turned ON. Further, the high logic value signal (WLB) is applied along signal line 134 to the gate of PMOS transistor 112 and PMOS transistor 112 is turned OFF. Also, the high logic value signal (WLB) is inputted to the MUX gate 124 from signal line 134, though when read assist is enabled the MUX gate 124 selects the input from the NAND gate output (PULSE).

As shown, the high logic value signal (WLB) is received and inverted by inverter 136 to form a low logic value inverted signal (WLBB). The low logic value inverted signal (WLBB) outputted by inverter 136 is received as an input by NAND gate 128. Further, the high logic value signal (WLB) is received and delayed by delay device 138 to form a high logic value delayed signal (WLBD). The high logic value delayed signal (WLBD) eventually outputted by delay device 138 is received as an input by NAND gate 128.

When signal (WLB) is changed from a low logic value to a high logic value, the inverter immediately forms the low logic value inverted signal (WLBB). However, the delay device 138 delays the change from the low logic value to the high logic value in the delayed signal (WLBD) for a delay period. The duration of the delay period may be selected and controlled through design of the delay device 138 as is known in the art. Thus, for an initial period after the signal (WLB) is changed from a low logic value to a high logic value, the NAND gate 128 receives a low logic value inverted signal (WLBB) and a low logic value delayed signal (WLBD). Thus, the NAND gate 128 provides a high logic value output (PULSE) during the initial period after signal (WLB) is changed from a low logic value to a high logic value. After the delay period, the delay device 138 outputs a high logic value delayed signal (WLBD). Thus, after the delay period, the NAND gate 128 receives a low logic value inverted signal (WLBB) and a high logic value delayed signal (WLBD) and still provides a high logic value output (PULSE).

Both during and after the delay period when signal (WLB) is changed from a low logic value to a high logic value, a high logic value output signal (PULSE) is inputted to the MUX gate 124. Because read assist is enabled, the MUX gate selects the high logic value output signal (PULSE). As a result, MUX gate 124 provides a high logic value output (PM1) to the gate of PMOS transistor 102. Therefore, PMOS transistor 102 is turned OFF. The high logic value output signal (PULSE) is also inputted to the OR gate 126. Thus, OR gate 126 necessarily outputs a high logic value as an output (PM2) to the gate of PMOS transistor 104 and causes the PMOS transistor 104 to be turned OFF.

As a result, when read assist is enabled and signal (WLB) has a high logic value, both PMOS transistor 102 and PMOS transistor 112 are OFF, and NMOS transistor 122 is ON. Therefore, WL output is low logic value "0".

Table 4a and 4b describes the status of transistors and operation described above.

TABLE 4a

Read Assist Enabled, During Delay Period When WLB changed to 1

| | | |
|---|---|---|
| WLB = 1 | PFET 112 OFF | NFET 122 ON |
| RASS = 1 | PFET 114 ON | MUX selects PULSE |
| NAND/PULSE = 1 | PFET 102 OFF | PFET 104 OFF |
| | | WL = 0 |

TABLE 4b

Read Assist Enabled, After Delay Period When WLB Changed to 1

| | | |
|---|---|---|
| WLB = 1 | PFET 112 OFF | NFET 122 ON |
| RASS = 1 | PFET 114 ON | MUX selects PULSE |
| NAND/PULSE = 1 | PFET 102 OFF | PFET 104 OFF |
| | | WL = 0 |

While Table 3 describes operation when read assist is enabled and signal (WLB) has a low logic value, the delay effect at the NAND gate 128 was not described. Thus, Table 3 provides operational values after a delay period, when the delayed signal (WLBD) and inverted signal (WLBB) are of opposite value. During the initial delay period, the low logic value signal (WLB) is inverted by inverter 136 to form a high logic value inverted signal (WLBB) while the delay device 138 continues to output a high logic value delayed signal (WLBD).

Thus, during the delay period after a change in signal (WLB) from high logic value to low logic value, the NAND gate 128 receives a high logic value inverted signal (WLBB) and a high logic value delayed signal (WLBD). The NAND gate 128 necessarily outputs a low logic output signal (PULSE). The delay period after signal (WLB) changes from high logic value to low logic value is the only time during operation of the read assist circuit 100 when the NAND gate 128 receives two high logic value inputs and the only time during operation of the read assist circuit 100 when the NAND gate 128 outputs a low logic output signal (PULSE). In effect, the NAND gate 128 provides a low logic output pulse for a duration having a pulse width equal to the delay period.

The low logic value output signal (PULSE) is inputted to the MUX gate 124. Because read assist is enabled, the MUX gate selects the low logic value output signal (PULSE). As a result, MUX gate 124 provides a low logic value output (PM1) to the gate of PMOS transistor 102. Therefore, PMOS transistor 102 is turned ON. The low logic value output signal (PULSE) is also inputted to the OR gate 126. Thus, OR gate 126, having received a low logic value inverted select signal on select line 130, outputs a low logic value as an output (PM2) to the gate of PMOS transistor 104 and causes the PMOS transistor 104 to be turned OFF.

As a result, when read assist is enabled and during the delay period after signal (WLB) is changed from a high logic value to a low logic value, both PMOS transistor 102 and PMOS transistor 104 are ON and a reduced voltage is applied to the wordline (WL) through the voltage divider 106 formed by PMOS transistor 102 and PMOS transistor 104. The reduced voltage is applied while a higher current is conducted by PMOS transistors 102 and 104. At the same time, both PMOS transistor 112 and PMOS transistor 114 are ON and a reduced voltage may be applied to the wordline (WL) through the voltage divider 116 formed by PMOS transistor 112 and PMOS transistor 114. However, the voltage divider 116 conducts a lower current compared to voltage divider 106, and voltage divider 106 may be considered to drive the wordline (WL) to the high logic value.

Table 5 describes the status of transistors and operation described above.

TABLE 5

Read Assist Enabled, During Delay Period When WLB changed to 0

| | | |
|---|---|---|
| WLB = 0 | PFET 112 ON | NFET 122 OFF |
| RASS = 1 | PFET 114 ON | MUX selects PULSE |
| NAND/PULSE = 0 | PFET 102 ON | PFET 104 ON |
| | | WL = 1 |

Figure 6:
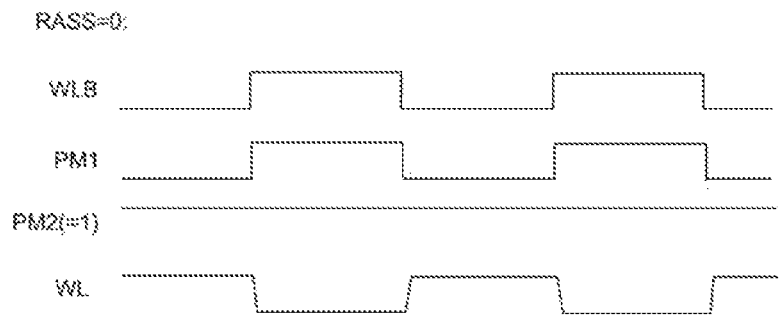
FIG. 6 is a timing chart that depicts the operation of the read assist circuit of FIG. 5 when read assist is disabled.

FIG. 6 illustrates a timing chart for explaining the operation of the read assist circuit 100 of FIG. 5, when read assist is disabled, in an ordinary cycle of the SRAM, illustrating the high/low logic status of signal (WLB), logic gate 124 output (PM1) applied to gate of transistor 102, logic gate output 126 (PM2) applied to gate of transistor 104, and signal (WL) applied to wordline 30, as described above in Tables 1-2.

Figure 7:
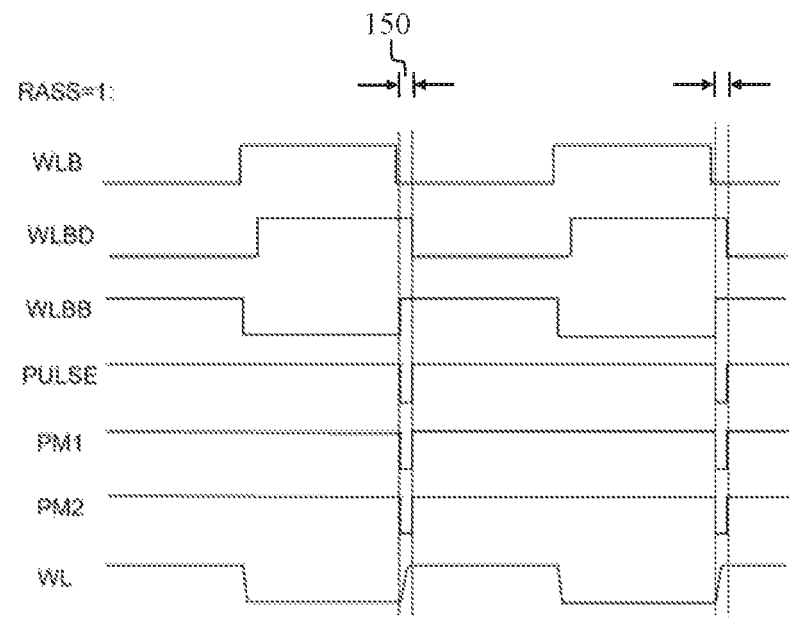
FIG. 7 is a timing chart that depicts the operation of the read assist circuit of FIG. 5 when read assist is enabled.

FIG. 7 illustrates a timing chart for explaining the operation of the read assist circuit 100 of FIG. 5, when read assist is enabled, in an ordinary cycle of the SRAM, illustrating the high/low logic status of signal (WLB), delayed signal (WLBD), inverted signal (WLBB), NAND gate output (PULSE), logic gate 124 output (PM1) applied to gate of transistor 102, logic gate output 126 (PM2) applied to gate of transistor 104, and signal (WL) applied to wordline 30, as described above in Tables 3-5.

The delay period is identified in FIG. 7 with a pulse width 150. In an exemplary embodiment, the pulse width 150 has a duration of less than about 5 nanoseconds (ns), such as less than 2 ns. An exemplary pulse width 150 has a duration of from about 0.2 ns to about 1 ns. As shown, the wordline signal (WL) is driven from a low logic value to a high logic value during the pulse width 150. As mentioned above, the delay device 138 may be designed and controlled to provide any desired pulse width 150, such that the wordline (WL) is successfully driven to the high logic value during the duration of the pulse width 150. After the delay period, transistors 102 and 104 are turned OFF by logic gate outputs (PM1) and (PM2) while transistors 112 and 114 continue to conduct a lower current with the reduced voltage to maintain the wordline (WL) at the high logic value.

As described herein, a read assist circuit capable of pulling down the wordline high logic value ("1") voltage while providing high wordline driving speed with reduced current consumption as compared to conventional techniques. Specifically, during a read assist operation, a large PMOS transistor is temporarily activated for the duration of a pulse width to quickly drive a wordline from low logic value to high logic value. The large PMOS transistor conducts a large current. Thereafter, the large PMOS transistor is deactivated and a smaller PMOS transistor maintains the voltage applied to the wordline while using a smaller current. As a result, a large current is not activated during the entire time period that the read assist voltage is applied to the wordline, unlike conventional techniques.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A read assist circuit for use in a semiconductor memory device, the read assist circuit comprising:
    a first drive device for driving a wordline of the semiconductor memory device to a wordline driving voltage, wherein the first drive device operates at a first current; and
    a second drive device for maintaining the wordline of the semiconductor memory device at the wordline driving voltage, wherein the second drive device operates at a second current, and wherein the second current is lower than the first current, wherein the read assist circuit is configured to activate the first drive device for a pulse width, and wherein the read assist circuit is configured to maintain the second drive device when the first drive device is not activated.

2. The read assist circuit of claim 1 wherein the second current is less than about 10% of the first current.

3. The read assist circuit of claim 1 further comprising a pulse forming circuit comprising:
    a series of buffers to convert a first signal to a delayed signal;
    an inverter to convert the first signal to an inverted signal; and
    a NAND gate to receive the delayed signal and the inverted signal and to generate a pulse signal having the pulse width.

4. The read assist circuit of claim 3 further comprising:
    a select line; and
    a multiplexer to receive a select signal from the select line, the pulse signal from the NAND gate, and the first signal.

5. The read assist circuit of claim 4 further comprising an OR gate to receive the select signal from the select line and the pulse signal from the NAND gate.

6. The read assist circuit of claim 5 wherein:
    the first drive device comprises a first transistor and a second transistor connected in series;
    the wordline is coupled to the first drive device intermediate the first transistor and the second transistor;
    a gate of the first transistor is coupled to an output of the multiplexer;
    a gate of the second transistor is coupled to an output of the OR gate; and
    wherein the first transistor and the second transistor have an ON state in which the first current passes from a first voltage supply through the first transistor and the second transistor to a first ground voltage.

7. The read assist circuit of claim 6 wherein:
    the second drive device comprises a third transistor and a fourth transistor connected in series;
    the wordline is coupled to the second drive device intermediate the third transistor and the fourth transistor;
    a gate of the third transistor is coupled to the first signal;
    a gate of the fourth transistor is coupled to the select line; and
    wherein the third transistor and the fourth transistor have an ON state in which the second current passes from a second voltage supply through the third transistor and the fourth transistor to a second ground voltage.

8. The read assist circuit of claim 7 wherein the second current is less than half of the first current.

9. The read assist circuit of claim 7 wherein the second current is from about 5% to about 20% of the first current.

10. An integrated circuit including a semiconductor memory device comprising:
    an array of bit cells;
    a plurality of wordlines, wherein each bit cell of the array of bit cells is selectively coupled to a wordline of the plurality of wordlines and access to a selected bit cell of the array of bit cells requires an asserted voltage on a selected wordline with which the selected bit cell is associated; and
    read assist circuitry configured, when read access to the selected bit cell is carried out, to implement a reduction in the asserted voltage on the selected wordline, wherein the read assist circuitry is configured to drive the selected wordline to the asserted voltage using a first current and to maintain the selected wordline at the asserted voltage using a second current lower than the first current, and
    wherein the read assist circuitry includes a pulse forming circuit comprising a series of buffers to convert a first signal to a delayed signal, an inverter to convert the first signal to an inverted signal, and a NAND gate to receive the delayed signal and the inverted signal and to generate an output that selectively activates the first current, and/or wherein the read assist circuitry includes a first voltage divider that conducts the first current and a second voltage divider that conducts the second current.

11. The integrated circuit of claim 10 wherein the first voltage divider and the second voltage divider are each coupled to a common supply voltage and apply a same asserted voltage on the selected wordline.

12. The integrated circuit of claim 11 wherein the read assist circuitry includes a pulse forming circuit comprising:
  a series of buffers to convert a first signal to a delayed signal;
  an inverter to convert the first signal to an inverted signal; and
  a NAND gate to receive the delayed signal and the inverted signal and to generate an output; wherein the first voltage divider is selectively activated by the output to conduct the first current.

13. The integrated circuit of claim 12 wherein memory device further comprises:
  a select line; and
  a multiplexer to receive a select signal from the select line, the output from the NAND gate, and the first signal.

14. The integrated circuit of claim 13 further comprising an OR gate to receive the select signal from the select line and the output from the NAND gate.

15. The integrated circuit of claim 14 wherein the first voltage divider is coupled to an output of the multiplexer and to an output of the OR gate, and wherein the first voltage divider has an ON state in which the first voltage divider conducts the first current.

16. The integrated circuit of claim 15 wherein the second voltage divider is coupled to the first signal and to the select line, and wherein the second voltage divider has an ON state in which the second voltage divider conducts the second current.

17. An integrated circuit comprising:
  a first voltage divider for driving a line of a semiconductor device to a driving voltage, wherein the first voltage divider operates at a first current; and
  a second voltage divider for maintaining the line of the semiconductor device at the driving voltage, wherein the second voltage divider operates at a second current, and wherein the second current is lower than the first current.

18. The integrated circuit of claim 17 wherein the first voltage divider and the second voltage divider are each coupled to a common supply voltage and apply a same asserted voltage on the line.

19. The integrated circuit of claim 17 further comprising:
  a series of buffers to convert a first signal to a delayed signal;
  an inverter to convert the first signal to an inverted signal; and
  a NAND gate to receive the delayed signal and the inverted signal and to generate an output that selectively activates the first voltage divider to conduct the first current.

20. The integrated circuit of claim 18 further comprising:
  a select line;
  a multiplexer to receive a select signal from the select line, the output from the NAND gate, and the first signal; and
  an OR gate to receive the select signal from the select line and the output from the NAND gate; and wherein:
  the first voltage divider is coupled to an output of the multiplexer and to an output of the OR gate;
  the first voltage divider has an ON state in which the first voltage divider conducts the first current;
  the second voltage divider is coupled to the first signal and to the select line; and
  the second voltage divider has an ON state in which the second voltage divider conducts the second current.

* * * * *